(12) United States Patent
Claxton

(10) Patent No.: US 6,448,919 B1
(45) Date of Patent: Sep. 10, 2002

(54) ADC SHARING FOR KEYPAD AND TOUGH PANEL OF A PHONE

(76) Inventor: Daniel Claxton, 16575 Zumque St., Rancho Santa Fe, CA (US) 92067

( * ) Notice: Subject to any disclaimer, the term of this patent is extended or adjusted under 35 U.S.C. 154(b) by 0 days.

(21) Appl. No.: 09/565,682

(22) Filed: May 5, 2000

Related U.S. Application Data

(60) Provisional application No. 60/132,823, filed on May 6, 1999.

(51) Int. Cl.[7] ................................................ H03M 1/12
(52) U.S. Cl. ...................................... 341/155; 341/120
(58) Field of Search ............................ 341/155, 22, 20, 341/108, 110, 118, 120; 340/711

(56) References Cited

U.S. PATENT DOCUMENTS 5,126,725 A * 6/1992 Yanagisawa ................. 340/711
5,175,873 A * 12/1992 Goldenberg et al. ........... 455/89
5,995,033 A * 11/1999 Roeckner et al. ............ 341/155
6,164,853 A * 12/2000 Foote .......................... 400/489

FOREIGN PATENT DOCUMENTS

| CN | 115 890 A | 1/1996 |
| EP | 0 797 305 A1 | 9/1997 |

* cited by examiner

*Primary Examiner*—Peguy Jeanpierre
*Assistant Examiner*—Joseph Lauture
(74) *Attorney, Agent, or Firm*—Philip R. Wadsworth; Charles D. Brown; George C. Pappas

(57) ABSTRACT

A keypad that produces a voltage level indicative of a key pressed and a touch panel that produces a voltage level indicative of a location on the touch panel that has been pressed are both coupled to the input of an analog-to-digital converter (ADC). A processor, coupled to the output of the ADC, reads the ADC output.

17 Claims, 4 Drawing Sheets

ADC SHARING FOR KEYPAD AND TOUGH PANEL OF A PHONE

CROSS-REFERENCE TO OTHER APPLICATIONS

The following applications of common assignee contain some common disclosure as the present application:

U.S. Patent Application entitled "Flip Phone With PDA and Mode Selection", filed May 5, 2000, U.S. Patent Application entitled "Detection of Flip Closure State of a Flip Phone", filed May 5, 2000, U.S. Patent Application entitled "Two-Pin Connection for Portable Phone Keypad", filed May 5, 2000, U.S. Patent Application entitled "Selecting Flip-Phone Operating Mode Using Flip Position", filed May 5, 2000,

BACKGROUND OF THE INVENTION

This application claims benefit to U.S. provisional application Ser. No. 60/132,823, filed May 6, 1999.

1. Field of the Invention

The present invention relates generally to the field of mobile communications. More particularly, the present invention relates to a system and method for sharing one analog-to-digital converter (ADC) between a keypad and touch panel.

2. Related Art

Many mobile communications devices are now combining wireless phone technology with hand-held computer platforms that provide personal information management. Such hand-held computer devices are called personal digital assistants (PDAs). Combination mobile communications devices usually operate as two separate instruments, requiring separate liquid crystal displays (LCDs) and additional circuitry to read the separate input devices of the wireless phone and the PDA.

Matrix encoded keyboards and keypads are used extensively as input devices for computers and telephones. Such keyboards and keypads are usually mounted on a flex circuit and require multiple signals to detect which key is pressed. For example, a 4 by 4 matrix keypad, which contains sixteen input keys, requires eight signals. When the keyboard or keypad is implemented on a flip cover, as may be the case with a wireless phone or PDA, multiple signals are routed to the body of the communications device through a hinge. The routing of multiple signals through a hinge causes the instrument to be less durable and may lead to the breakage of the hinge if the instrument is constantly picked up by grasping the flip cover.

Many PDAs require a two-channel analog-to-digital converter (ADC) to read the touch panel. When the PDA is combined with a wireless telephone that implements the keypad on a flip cover, additional circuitry usually includes an additional ADC to read the keypad on the flip cover and an additional LCD for the wireless telephone display.

What is needed is an efficient and cost effective way to integrate a PDA and wireless telephone with a flip cover that is lightweight, durable, and easy to operate.

What is further needed is the integration of a PDA and wireless telephone that work together by allowing the keypad and touch panel to share one ADC.

SUMMARY OF THE INVENTION

The present invention satisfies the above mentioned needs by providing a communications device that efficiently integrates a flip telephone with a personal digital assistant (PDA). The present invention operates as a single unit by sharing an ADC between a keypad and a touch panel. According to the present invention, a keypad that produces a voltage level indicative of a key pressed and a touch panel that produces a voltage level indicative of a location on the touch panel that has been pressed are both coupled to the input of an analog-to-digital converter (ADC). A processor, coupled to the output of the ADC, reads the ADC output.

An advantage of the present invention is cost. Only one ADC is needed. Also, the same software that reads the touch panel can be used to read the keyboard.

Further features and advantages of the invention, as well as the structure and operation of various embodiments of the invention, are described in detail below with reference to the accompanying drawings.

BRIEF DESCRIPTION OF THE FIGURES

The features, objects, and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE PREFERRED EMBODIMENTS

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

The present invention is directed toward a system and method for sharing one analog-to-digital converter between a keypad and a touch panel. A keypad that produces a voltage level indicative of a key pressed and a touch panel that produces a voltage level indicative of a location on the touch panel that has been pressed is coupled to the input of an ADC. The ADC converts the analog signal to a digital signal to be read by a microprocessor.

In many handheld electronic devices, data is entered via a keypad, and the keypad entry is read by an ADC. Use of another input means, such as a touch panel, requires the implementation of another ADC. The present invention efficiently and cost effectively integrates a telephone and PDA by sharing the ADC between the keypad and the touch panel. Although the present invention is described in terms of a communications device comprising a combination flip telephone and personal digital assistant (PDA), the present invention is also applicable to other multi-functional communications devices that employ more than one input device utilizing an ADC before being read by a processor.

Figure 1:
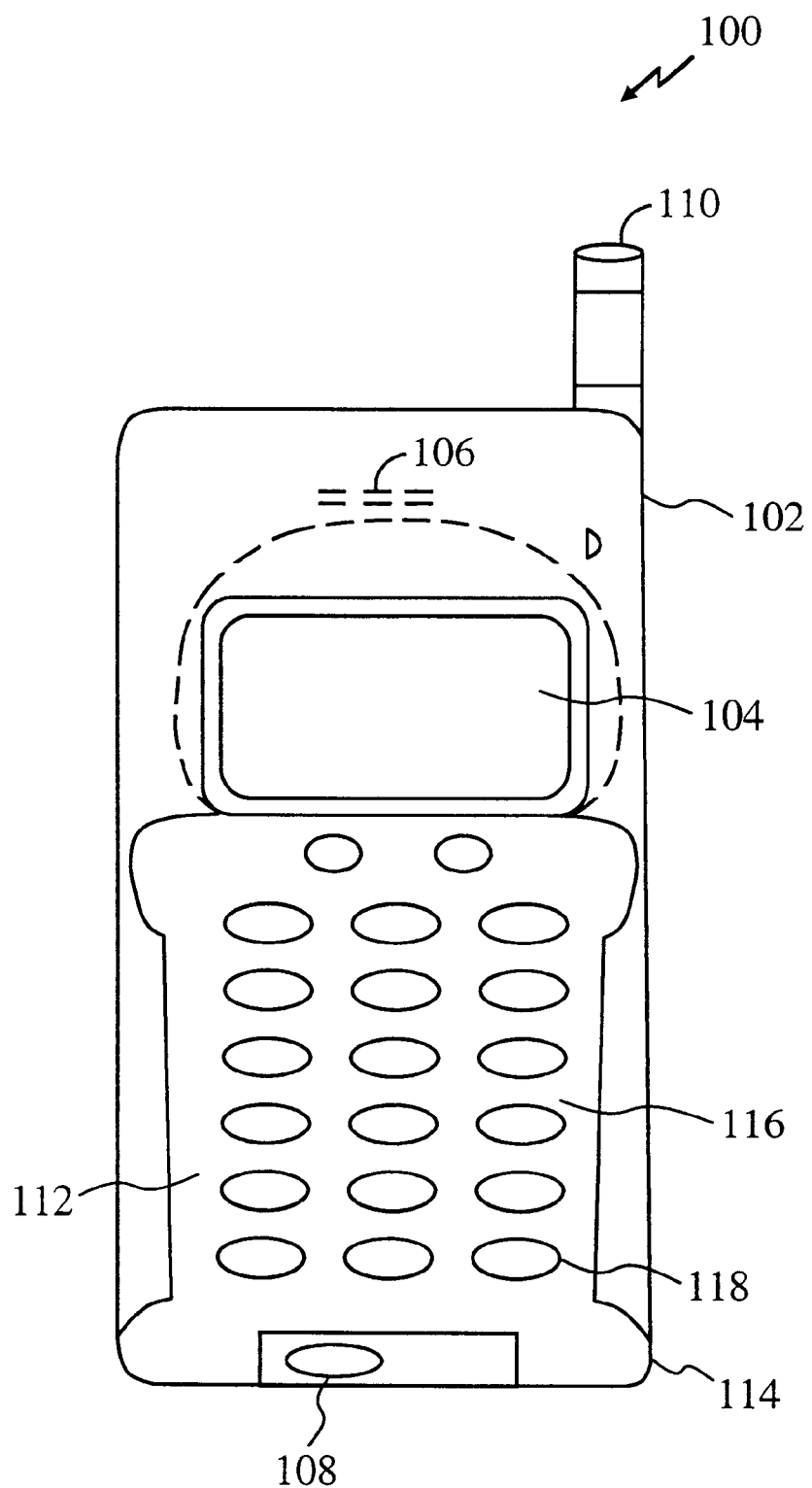
FIG. 1 is a diagram illustrating a communications device with the flip cover in the closed position.

Prior to describing the invention in detail, a description of the communications device is provided. The communications device operates as a standard cellular telephone when the flip cover is in the closed position. This mode of operation is referred to as the KEYPAD mode. The communications device also operates as a PDA and telephone when the flip cover is in the open position. This mode of operation is referred to as the SMARTPHONE mode. FIG. 1 illustrates a front view of communications device 100 with the flip cover in the closed position, i.e., KEYPAD mode. Communications device 100 comprises a body 102 and a flip cover 112. Body 102 comprises a liquid crystal display (LCD) 104, a speaker 106, a microphone 108, and an antenna 110. Flip cover 112 comprises a flip hinge 114, an exterior surface 116, and an interior surface 208 (shown in FIG. 2). Flip hinge 114 is a jointed device that enables flip cover 112 to open and close by rotating flip cover 112 about flip hinge 114. Flip hinge 114 also allows flip cover 112 to be removably detached from the body 102 of communications device 100. Exterior surface 116 of flip cover 112 contains a keypad 118. Keypad 118 is a standard telephone keypad that is well known in the relevant art(s).

When flip cover 112 is closed, only a portion of LCD display 104 is exposed. This portion of LCD display 104 is used to display various telephone functions, such as the date, time, redial function and a menu. Also displayed is a signal strength indicator and a digital indicator. The signal strength indicator indicates the strength of the signal being received via antenna 110. The digital indicator indicates that the telephone is operating in digital mode. Microphone 108 and speaker 106 are used to convert variations in sound pressure, i.e., voice, to variations in electrical signals or variations in electrical signals into variations in sound pressure, i.e., voice, respectively. Antenna 110 is used to receive and transmit signals being sent to and from communications device 100.

Figure 2:
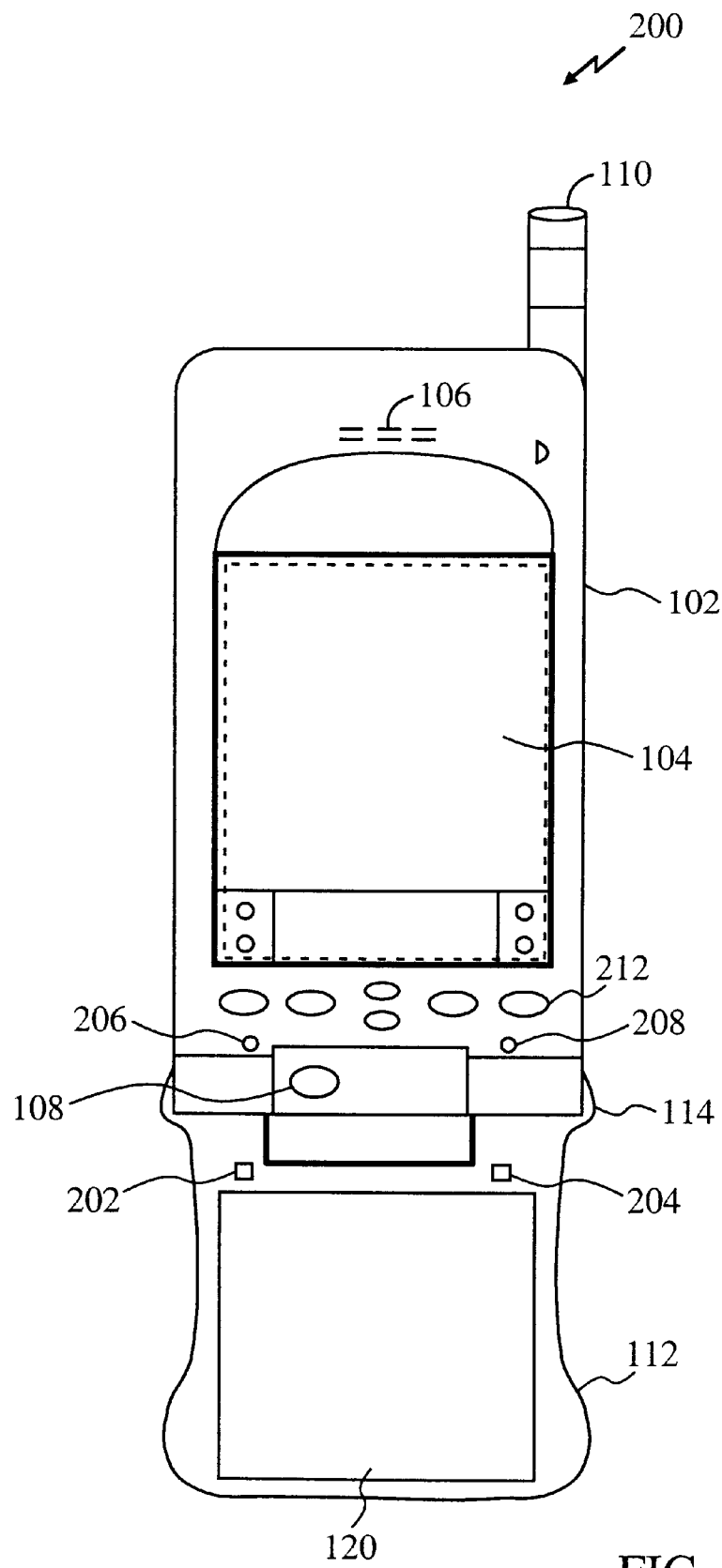
FIG. 2 is a diagram illustrating the communications device with the flip cover in the open position.

FIG. 2 illustrates a front view of communications device 100 with flip cover 112 in the open position, i.e., SMARTPHONE mode. Body 102 of communications device 100 displays a full view of LCD 104. The top portion of LCD 104 is used to display the functions of a telephone while the bottom portion of LCD 104 displays functions related to the PDA. Such functions include all of the personal management functions found on the Palm™ III organizer, such as date book, address book, to-do list, expense management, calculator, note-taking, and games, and e-mail, web, and Alert Manager functions. Body 102 of combination flip telephone and PDA 100 also contains PDA buttons 202, a first spring loaded pogo pin 204, and a second spring loaded pogo pin 206. PDA buttons 202 allow for user input into a microprocessor (shown in FIG. 3). Notice that microphone 108 is exposed when flip cover 112 is in both the closed and open positions. This is due to the open rectangular space at the bottom of flip cover 112.

Interior surface 208 of flip cover 112 contains a first contact 210 and a second contact 212. First contact 210 electrically connects with first spring loaded pogo pin 204 and second contact 212 electrically connects with second spring loaded pogo pin 206 to allow for user input from keypad 118 to a microprocessor 308.

The present invention is described in terms of the above example communications device comprising a flip telephone and PDA. Description in these terms is provided for convenience only. It is not intended that the invention be limited to application in this example communications device. In fact, after reading the following description, it will become apparent to those skilled in the relevant art(s) how to implement the invention with other communications devices having different components, functions, and levels of complexity.

Figure 3:
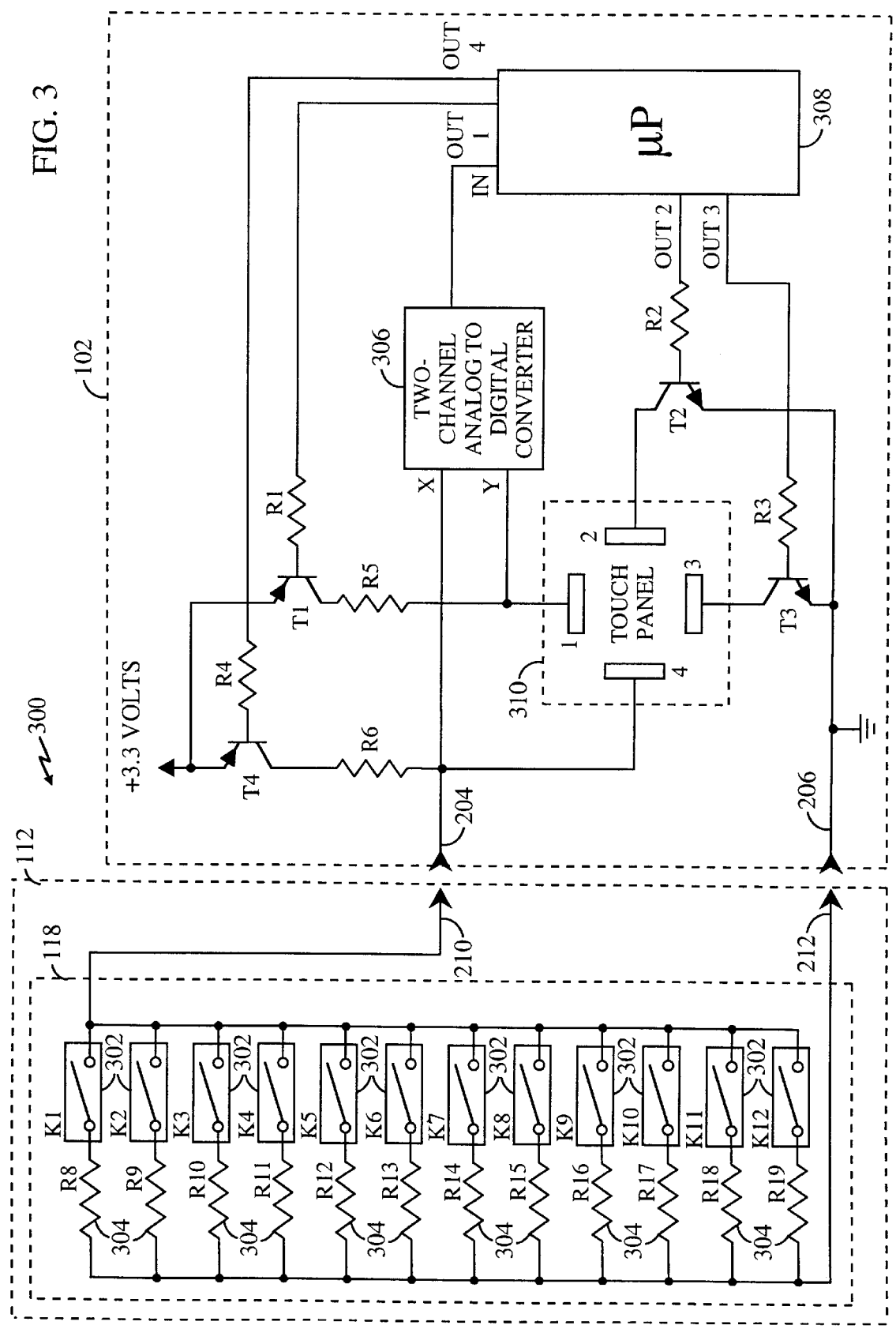
FIG. 3 is a circuit diagram illustrating an embodiment of the present invention.

FIG. 3 is a circuit illustrating an embodiment of the present invention. Circuit 300 shares a two-channel analog-to-digital converter (ADC) 306 between keypad 112 and a touch panel 310. The software used to read touch panel 310 can be used to read keypad 112. When flip cover 112 is in the closed position, ADC 306 receives its input from keypad 118. When flip cover 112 is open or completely removed from body 102 of communications device 100, ADC 306 receives its input from touch panel 310.

Circuit 300 includes circuitry from flip cover 112 and circuitry from body 102 of communications device 100. The circuitry from flip cover 112 electrically connects with the circuitry from body 102 of communications device 100 when flip cover 112 is in the closed position. First contact 210 electrically connects with first spring loaded pogo pin 204 and second contact 212 electrically connects with second spring loaded pogo pin 206 to allow for user input from keypad 118 to a microprocessor 308.

The circuitry found on flip cover 112 includes keypad 118 connected to first contact 210 on one side of keypad 118 and to second contact 212 on the other side of keypad 118. The circuitry for keypad 118 is a resistive ladder network. The resistive ladder network only requires two signals to indicate a pressed key on keypad 118: a voltage level and ground.

The resistive ladder network for keypad 118 includes a plurality of keys 302 connected to a plurality of resistors 304. Each key 302 is connected to one resistor 304. Each key 302 is also implemented as a switch. When a given key 302 is pressed, the resistance 304 associated with that key 302 provides a unique voltage level representing the pressed key 302 that distinguishes the pressed key 302 from any other key 302.

The circuitry from body 102 of communications device 100 includes first and second spring loaded pogo pins 204 and 206, two-channel analog-to-digital converter (ADC) 306, microprocessor 308, touch panel 310, two PNP transistors T1 and T4, two NPN transistors T2 and T3, and six resistors R1 through R6.

To operate communications device 100 in KEYPAD mode, flip cover 112 is in the closed position. User input is received via the keypad 118. Second spring loaded pogo pin 206 is connected to ground. First spring loaded pogo pin 204 is connected to ADC 306 and resistor R6. First spring loaded pogo pin 204 supplies the signal from flip cover 112 to the X-channel of ADC 306. ADC 306 digitizes the analog signal in order that the signal may be read by microprocessor 308. The microprocessor 308 outputs a signal called OUT4 to the base of PNP transistor T4 via resistor R4. OUT4 allows microprocessor 308 to control keypad 118 by turning the power to keypad 118 on and off. The emitter of PNP transistor T4 is connected to a voltage source $V_S$. $V_S$ is typically +3.3 volts, but may vary from application to application. The collector of PNP transistor T4 is connected to one end of resistor R6. The other end of resistor R6 is connected to the X-input of ADC 306.

To operate keypad 118, software running on microprocessor 308 enables microprocessor 308 to output, via signal OUT4, a high voltage level to the base of PNP transistor T4 through resistor R4 to turn on PNP transistor T4. When PNP transistor T4 is turned on, current flows from the voltage source $V_S$ through PNP transistor T4 to supply power to keypad 118. Resistor R6 is used to divide the signal being sent from flip cover 112 for input to the X-channel of ADC 306. When flip cover 112 is closed, ADC 306 receives as input the voltage signal from flip cover 112 routed through first and second contacts 210 and 212 to first and second spring loaded pogo pins 204 and 206. When a key 302 is pressed, the resistance associated with pressed key 302, is resistor 304. For example, the resistive value associated with key K1 is R8, key K2 is R9, key K3 is R10, and so on. The values of resistors R8 through R19 are chosen to give a unique resistance value for each key 302 on keypad 118.

To operate communications device 100 in SMART-PHONE mode, flip cover 112 is in the open position. User input is received via touch panel 310. Touch panel 310 behaves like a resistor. When one touches touch panel 310 with a pin, a resistance is created. The resistance varies depending upon the location touched on touch panel 310. Touch panel 310 is divided into four parts, 1–4. Each part 1–4 of touch panel 310 is controlled by one of four transistors T1–T4. PNP transistors T1 and T4 control the positive side of touch panel 310. Transistor T1 controls the positive side of touch panel 310 for the y-axis and transistor T4 controls the positive side of touch panel 310 for the x-axis. NPN transistors T2 and T3 control the negative side of touch panel 310. Transistor T2 controls the negative side of touch panel 310 for the x-axis and transistor T3 controls the negative side of touch panel 310 for the y-axis.

Microprocessor 308 controls the four transistors T1–T4. Signal OUT1 of microprocessor 308 is connected to the base of PNP transistor T1 via resistor R1. Signal OUT4 of microprocessor 308 is connected to the base of PNP transistor T4 via resistor R4. Both emitters from PNP transistors T1 and T4 are connected to a voltage source $V_S$. $V_S$ is typically +3.3 volts, but may vary from application to application. The collector of PNP transistor T1 is connected to one end of resistor R5. The other end of resistor R5 is connected to the Y-input of ADC 306 and the first part 1 of touch panel 310. The collector of PNP transistor T4 is connected to one end of resistor R6. The other end of resistor R6 is connected to the X-input of ADC 306 and the fourth part 4 of touch panel 310.

Signal OUT2 of microprocessor 308 is connected to the base of NPN transistor T2 via resistor R2. Signal OUT3 of microprocessor 308 is connected to the base of NPN transistor T3 via resistor R3. The collector of NPN transistor T2 is connected to the second part 2 of control panel 310. The collector of NPN transistor T3 is connected to the third part 3 of control panel 310. The emitters of both NPN transistors T2 and T3 are connected to ground.

When flip cover 112 is in the open position or detached from body 102 of communications device 100, ADC 306 receives as input the x and y voltage signals from touch panel 310. To read the x-axis of touch panel 310, transistors T4 and T2 must be turned on. To read the y-axis of touch panel 310, transistors T1 and T3 must be turned on. Turning on PNP transistors T1 and T4 applies power to the positive side of touch panel 310. Once power has been applied, turning on NPN transistors T2 and T3 drops the negative side of touch panel 310 to ground. This provides a unique resistance across touch panel 310.

In operation, software executing on microprocessor 308 detects when touch panel 310 is touched with a pin and enables signal OUT4 to output a high voltage level to the base of PNP transistor T4 through R4 to turn on PNP transistor T4. When PNP transistor T4 is turned on, current flows from the voltage source $V_S$ through PNP transistor T4 to supply power to part 4 of touch panel 310. Microprocessor 308 then enables signal OUT2 to output a high voltage level to the base of NPN transistor T2 through resistor R2 to turn on NPN transistor T2. When NPN transistor T2 is turned on, the ground signal flows through transistor T2 to part 2 of touch panel 310, thus dropping the negative part of touch panel 310 to ground. A resistance across touch panel 310 in the x-direction is generated. The resulting voltage level is divided by R6 before being input into the X-channel of ADC 306. The microprocessor 308 then enables signal OUT1 to output a high voltage level to the base of PNP transistor T1 through resistor R1 to turn on PNP transistor T1. When PNP transistor T1 is turned on, current flows from the voltage source $V_S$ through PNP transistor T1 to supply power to part 1 of touch panel 310. Microprocessor 308 then enables signal OUT3 to output a high voltage level to the base of NPN transistor T3 through resistor R3 to turn on NPN transistor T3. When NPN transistor T3 is turned on, the ground signal flows through transistor T3 to part 3 of touch panel 310, thus dropping the negative part of touch panel 310 to ground. A resistance across touch panel 310 in the y-direction is generated. The resulting voltage level is divided by R5 before being input into the Y-channel of ADC 306. Microprocessor 308, via software executing on microprocessor 308, accepts as input the digitized x and y voltage signals from ADC 306 via input signal IN and determines the location of the point made on touch panel 310.

Figure 4:
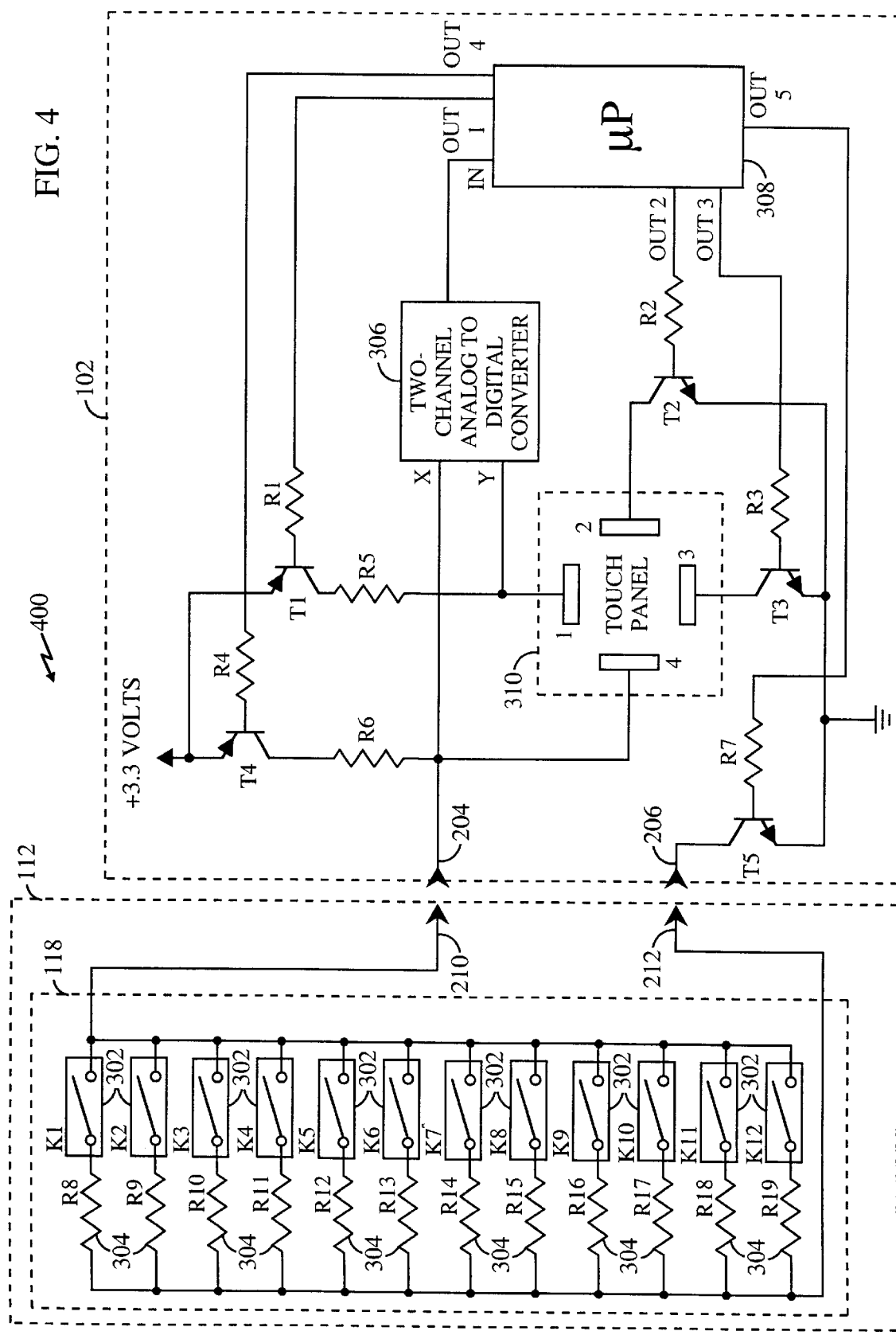
FIG. 4 is a circuit diagram illustrating an alternative embodiment of the present invention.

An alternative embodiment, shown in FIG. 4, allows the simultaneous operation of keypad 118 and touch panel 310. The operation of circuit 400 is similar to circuit 300 except that the reading of keypad 118 is now controlled by an additional NPN transistor T5. Second spring loaded pogo pin 206 is connected to the collector of NPN transistor T5. The emitter of NPN transistor T5 is connected to ground. The base of NPN transistor T5 is connected to resistor R7 and the other side of resistor R7 is connected to microprocessor 308 via signal OUT5. While OUT4 turns transistor T4 on through resistor R4 to supply power to keypad 112, OUT5 turns transistor T5 on through resistor R7 to drop the keypad circuitry to ground. This allows software executing on microprocessor 308 to simultaneously control keypad 118 and touch panel 310 while sharing one ADC between them.

Conclusion

While the present invention is described in terms of a communications device comprising a combination flip phone and PDA, the present invention is also applicable to other multi-functional portable devices that employ at least two input devices that generate a voltage level and requires conversion into a digital signal before being read by a processor. The previous description of the preferred embodiments is provided to enable any person skilled in the art to make or use the present invention. While the invention has been particularly shown and described with reference to preferred embodiments thereof, it will be understood by those skilled in the art that various changes in form and detail may be made therein without departing from the spirit and scope of the invention.

What is claimed is:

1. A circuit for use with first and second input devices, comprising:
    an analog-to-digital converter (ADC) having two channels for input of data thereto, the ADC being coupled to receive a first input into at least one of the two channels from the first device and a second input into both of the two channels from the second input device; and
    a processor to selectively process one or the other of the first and second inputs in digitized form from the ADC.

2. The circuit of claim 1, wherein the first device is a keypad and the first analog signal therefrom utilizes only a single channel of the ADC when the keypad is activated.

3. The circuit of claim 2, wherein the second device is a touch panel and the second analog signal utilizes each of the two channels to cooperatively represent a location pressed on the touch panel.

4. The circuit of claim 1, wherein the second device is a touch panel and the second analog signal utilizes each of the two channels to cooperatively represent a location pressed on the touch panel.

5. The circuit of claim 1, wherein the circuit is comprised in an electronic device, the first input device being a keypad adapted as a flip portion of the electronic device and the second input device being a touch panel adapted as a body portion of the electronic device.

6. The circuit of claim 5, wherein the flip portion is of the type including a first set of electrical contacts and the body portion a second set of electrical contacts, and the body portion is movably coupled to the flip portion.

7. The circuit of claim 6, further comprising an electrical connection between the first and second sets of contacts configured to be broken based on the open/close state of the flip portion, the processor being operable o detect an open or close state.

8. The circuit of claim 7, wherein the keypad is a resistive ladder circuit.

9. The circuit of claim 7, wherein the body portion is a personal digital assistant and includes the circuit.

10. The circuit of claim 7, wherein the second set of contacts are spring loaded pogo pins.

11. The circuit of claim 7, wherein the ADC receives the first input from the keypad when the flip portion is in a closed position.

12. The circuit of claim 7, wherein the ADC receives tie second input from the touch panel when the flip portion is in an open position.

13. The circuit of claim 7, wherein the ADC receives the second input from the touch panel when the flip portion is detached from the body portion.

14. The circuit of claim 7, further comprising a switching circuit for controlling power to the keypad.

15. The circuit of claim 14, wherein the processor controls the switching circuit.

16. The circuit of claim 7, further comprising a switching circuit for supplying power to the touch panel when a user touches the touch panel.

17. The circuit of claim 16, wherein the processor controls the switching circuit.

\* \* \* \* \*